Dec. 5, 1967 W. A. YONKERS 3,356,904

HEAT DISSIPATING ARRANGEMENT FOR ELECTRICAL COMPONENTS

Filed Dec. 7, 1966

INVENTOR
WILLIAM A. YONKERS

BY Rudolph J. Jurick
ATTORNEY

United States Patent Office 3,356,904

Patented Dec. 5, 1967

3,356,904

HEAT DISSIPATING ARRANGEMENT FOR ELECTRICAL COMPONENTS

William A. Yonkers, Mountain Lakes, N.J., assignor to RLF Industries, Inc., Boonton, N.J., a corporation of New Jersey Filed Dec. 7, 1966, Ser. No. 599,859
5 Claims. (Cl. 317—100)

ABSTRACT OF THE DISCLOSURE

An assembly for dissipating heat from encased electrical components carried by a circuit board, which assembly includes a heat transfer member constructed and arranged to engage the cases of the components when the board is secured to a housing.

*Background of the invention*

The invention relates to an arrangement for dissipating heat generated in electrical components by the flow of current therethrough.

Various heat sinks are known for preventing damage to an electrical component by excessive heat generated when the component forms an operating part of an electrical circuit. Generally, the component is mounted on a relatively large block made of a metal having good heat conductivity, which block includes a plurality of integral, heat-radiating fins. A separate heat sink is provided for each component, thereby adding to the cost of the electrical apparatus, particularly when the apparatus includes a plurality of electrical components which require this type of protection.

*Summary*

A circuit board, carrying electrical components having individual cases which become heated upon the flow of current through the components, is arranged for mounting in a metal housing by means including a screw and bolt. A heat transfer member in the form of a metal disc is carried by the screw and is brought into pressure contact with the component cases when the circuit board is secured to the housing. The disc serves as a common heat-dissipating means for a plurality of such components, thereby resulting in economy of production. In the case of silicon controlled rectifiers which have metal cases with flat tops, each rectifier is supported on an insulating spacer member constructed and arranged to maintain a flush contact between the heat-dissipating disc and the case tops, thereby to provide a maximum mutual surface area of contact for maximum transfer of heat from the components to the disc.

An object of the invention is the provision of an arrangement for dissipating heat generated in electrical components, which arrangement includes a common heat-transfer member in engagement with the cases of the components.

An object of the invention is the provision of an arrangement for securing a circuit board to a housing, and to dissipate heat generated in electrical components carried by the board, which arrangement comprises a heat-transfer disc, a screw passing through holes formed in the circuit board, housing and disc, and a nut threaded onto the screw thereby to clamp the said disc between the housing and the cases of the electrical components.

These and other objects and advantages of the invention will become apparent from the following description when taken with the accompanying drawings. It will be understood, however, that the drawings are for purposes of illustration and are not to be construed as defining the scope or limits of the claims, reference being had for the latter purpose to the claims appended hereto.

*Brief description of the drawings*

In the drawings wherein lie reference characters denote like parts in the several views.

*Description of the preferred embodiment*

Figures 1, 2, 3, 4, 5:
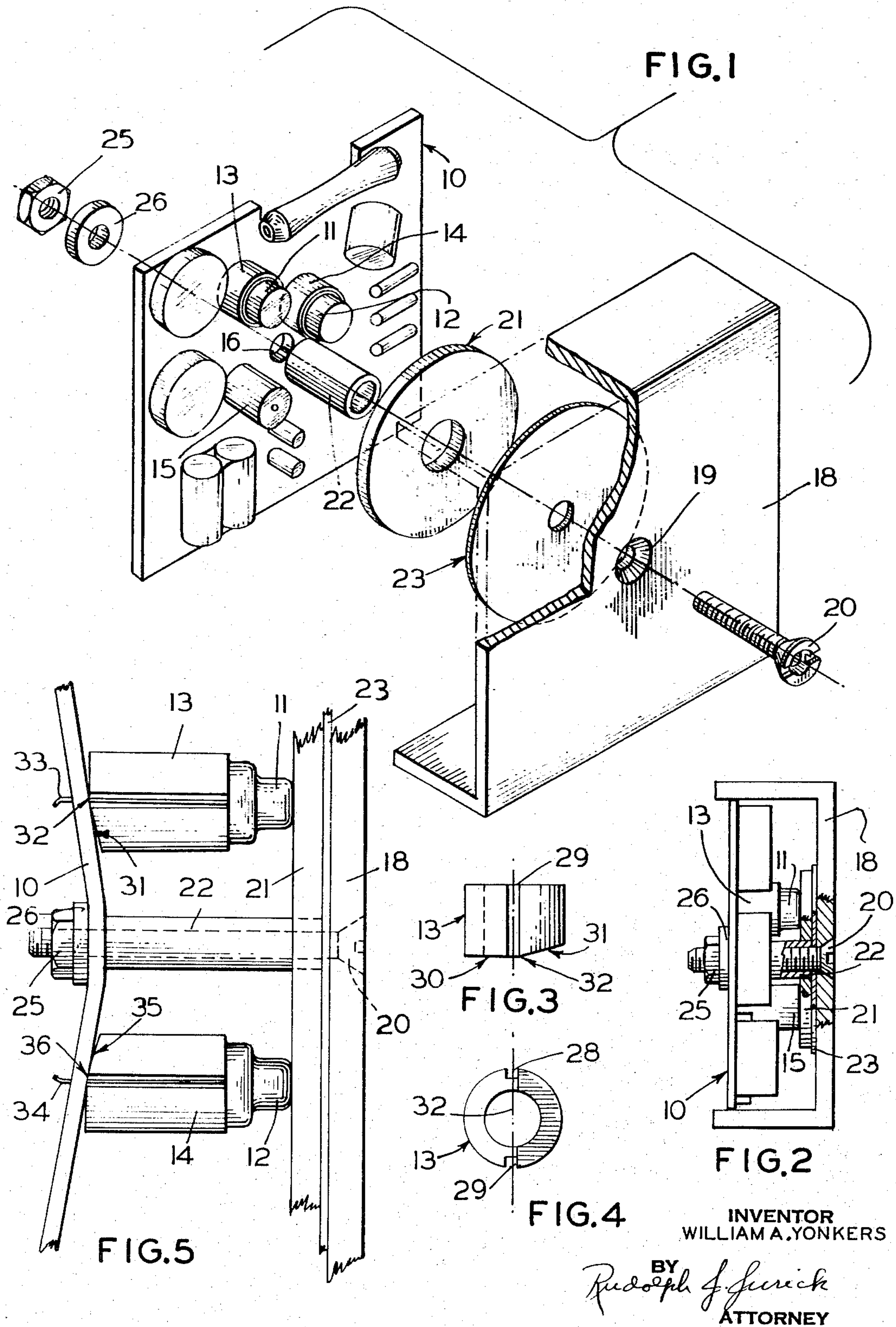
FIGURE 1 is an exploded isometric view showing the components which go to make up apparatus embodying this invention.
FIGURE 2 is a side view of the assembled apparatus with portions shown in cross-section.
FIGURE 3 is a side elevational view of one of the spacer members.
FIGURE 4 is a bottom view thereof.
FIGURE 5 is a diagrammatic representation illustrating the function of the spacer members.

Referring to FIGURE 1 of the drawings the numeral 10 identifies a circuit board made of a suitable plastic and carrying various electrical components on the front surface, which components have leads passing through holes formed in the board and connected to a printed circuit formed on the rear surface of the board. The type of components and the circuit wiring depend upon the particular apparatus and for purposes of description the apparatus will be referred to as a proportional temperature controller. The apparatus for controlling temperature is carried by the board 10 with the exception of the temperature sensing element. Although not shown in the drawings, those skilled in this art will understand that the board carries terminals to which the sensing element and power leads are connected. In the case of a proportional controller, the components pertinent to the invention are two silicon controlled rectifiers 11 and 12. Such rectifiers are each enclosed within a metal can having a flat top, with the can forming one terminal for connection of the rectifier into an electrical circuit. Each rectifier is spaced from the board by the associated spacer members 13 and 14 made of an insulating material. The construction of the spacer members will be described hereinbelow. Secured to the board is an insulator post 15 having a flat end lying in the same plane as the flat tops of the two rectifier cans. This post and the rectifiers are substantially equally spaced from each other and a central hole 16 formed in the board.

The U-shaped housing 18 is made of a material having a good thermal conductivity such as, for example, aluminum, and is provided with a central hole 19 for receiving a screw 20. The heat transfer member comprises the disc 21 also made of aluminum and having a central hole formed therein said disc having a diameter exceeding that of a circle concentric with the hole 16 and circumscribing the post 15 and the rectifiers 11 and 12. In the assembled apparatus, the disc 21 is electrically isolated from the housing 18 by means of an insulator bushing 22 and thin mica disc 23, the latter having a diameter somewhat greater than that of the heat transfer disc 21. The outside diameter of the bushing 22 is greater than that of the hole formed in the mica disc and the hole 16 formed in the board 10.

As shown in FIGURE 2, the circuit board 10 and the housing 18 are assembled together by passing the screw 20 through the holes of the housing, mica disc 23, heat transfer disc 21 and the circuit board. Upon tightening of the nut 25 against the plastic washer 26 the parts are clamped together with the heat transfer disc 21 in firm engagement with the insulator post 15 and the flat tops of the two rectifier cans. The insulator bushing 22 extends from the circuit board to the mica washer, whereby the washer and the mica disc serve to electrically isolate the heat transfer disc from the screw 20 and the housing 18.

The aluminum heat transfer disc has a relatively large mass, compared to that of the rectifier cans, and a high thermal conductivity, so that heat is rapidly conducted from the rectifiers and dissipated to the atmosphere. At the same time, the disc has a relatively large surface area spaced from the bottom wall of the housing 18 by the mica disc having a thickness of the order of 0.002" so that there is a fairly good transfer of heat from the disc 21 to the housing.

In order to provide a maximum rate of heat transfer from the rectifiers to the aluminum disc 21, it is desirable that flat tops of the rectifier cans be in flush contact with the disc and that the mutual surface areas of contact of these members be maintained under pressure. The circuit board 10 preferably is a glass base epoxy laminate having a thickness of about 1/16 inch. Consequently, the board is bowed inwardly when the nut 25 is tightened to maintain a suitable pressure between the rectifier cans and the heat transfer disc. Such bowing of the board may result in a tilting of the rectifiers whereby the top surfaces of the cans would not be in flush contact with the heat transfer disc. In order to prevent such undesirable tilting of rectifiers, the spacer members 13 and 14 (disposed between each rectifier and the circuit board as shown in FIGURE 1) each have a multi-planar end surface abutting the circuit board, as will now be described.

As shown in FIGURES 3 and 4, the spacer member 13 comprises a bushing made of a plastic and having diametrically opposed, longitudinal channels 28 and 29 formed in the outer wall thereof. One half of one end surface, identified by the numeral 30, lies in a plane normal to the bushing axis, whereas the other half of such surface, identified by the numeral 31, is sloped at an angle of approximately 15 degrees. The line of demarkation 32 between these end surfaces falls substantially on the bushing diameter. The rectifier is carried by the other end of the bushing, which is mono-planar, and the rectifier leads pass through the center hole of the bushing and the channels 28 and 29.

Reference now is made to the diagrammatic representation of FIGURE 5 which shows the base of the circuit board 10, mica disc 23 and heat transfer disc 21 secured to the housing 18 by means of the screw 20 and nut 25. The rectifiers 11 and 12 are carried by the similar spacer members 13 and 14. This figure shows a lead of each rectifier, identified by the numerals 33 and 34, extending through the longitudinal channel of the spacer member and through holes formed in the circuit board. Those skilled in this art will understand that all four leads of each rectifier pass through holes formed in the board and are soldered to the printed circuit formed on the opposite surface of the board. The bowed configuration of the circuit board, when the nut 25 is tightened to provide a good contact pressure between the heat transfer disc 21 and the flat tops of the rectifier cans, is here exaggerated for purposes of illustration. It will be apparent that if the spacer members 13 and 14 have mono-planar end surfaces abutting the circuit board the bowed circuit board will result in a tilting of the spacer members and the rectifiers. However, in the illustrated construction, the spacer members 13 and 14 are so oriented that their sloping end surfaces 31 and 35 are directed toward the axis of the screw 20 with the lines of demarkation 32 and 36 tangent to the circle passing through the axes of the two spacer members. Consequently, the pressure exerted upon the spacer members by the circuit board is applied substantially along such lines of demarkation and axially of the spacer members, thereby maintaining a flush contact between the heat transfer disc 21 and the rectifier cans even upon a considerable distortion of the circuit board.

Having now described the invention, those skilled in this art will be able to make various changes and modifications without thereby departing from the spirit and scope of the invention as recited in the following claims.

What is claimed is:

1. Apparatus comprising,
- (a) a generally rectangular circuit board carrying a plurality of spaced heat generating components enclosed within individual cases,
- (b) a U-shaped metal housing member having legs spanning opposite ends of the circuit board,
- (c) a flat heat transfer member, and
- (d) fastening means securing the said circuit board to the housing member with the said heat transfer member clamped between the said cases and the base portion of said housing member.

2. The invention as recited in claim 1, wherein the said cases are metal and including an electrical insulator disc positioned between the heat transfer member and the housing member.

3. The invention as recited in claim 2, wherein the said fastening means comprises a screw passing through holes formed in the said housing member, insulator disc, heat transfer member and circuit board; and a nut threaded onto the said screw.

4. Apparatus comprising
- (a) a generally rectangular circuit board having a hole formed therein,
- (b) silicon controlled rectifiers enclosed within individual metal cases having flat tops,
- (c) spacer members, each spacer member having one end in engagement with the circuit board and the other end supporting a rectifier with the flat tops of the rectifier cases lying substantially in a common plane parallel to that of the circuit board,
- (d) a heat transfer plate spanning the flat tops of the rectifier cases and having a hole formed therein,
- (e) a U-shaped metal housing having a hole formed in the base portion thereof and legs spanning opposite ends of the circuit board,
- (f) means electrically isolating the heat transfer plate from the said housing,
- (g) a screw passing through the holes formed in the housing base portion, the heat transfer member and the circuit board, and
- (h) a nut threaded onto the said screw, the recited arrangement being such that the tops of the rectifier cases are pressed into engagement with the heat transfer plate when the said nut is drawn up against the circuit board.

5. The invention as recited in claim 4, wherein the said spacer members have axes lying on a circle concentric with the hole formed in the circuit board, wherein the end of each spacer member engaging the circuit board includes a sloping surface portion terminating in a diametrical line of demarkation, and wherein the line of demarkation of each spacer member is substantially tangent to the said circle.

References Cited

UNITED STATES PATENTS

| | | | |
|---|---|---|---|
| 2,924,809 | 2/1960 | Wilson. | |
| 3,249,680 | 5/1966 | Sheets et al. | 174—16 |
| 3,299,946 | 1/1967 | Recklinghausen | 317—100 X |

ROBERT S. MACON, *Primary Examiner.*

ROBERT K. SCHAEFER, *Examiner.*

M. GINSBURG, *Assistant Examiner.*